(12) United States Patent
Sato (10) Patent No.: US 11,854,767 B2
(45) Date of Patent: Dec. 26, 2023

(54) MEASURING METHOD AND PLASMA PROCESSING APPARATUS

(71) Applicant: Tokyo Electron Limited, Tokyo (JP)

(72) Inventor: Masanori Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 145 days.

(21) Appl. No.: 17/220,094

(22) Filed: Apr. 1, 2021

(65) Prior Publication Data

US 2021/0313146 A1    Oct. 7, 2021

(30) Foreign Application Priority Data

Apr. 3, 2020   (JP) ................. 2020-067730

(51) Int. Cl.
*H01J 37/32*   (2006.01)
*H01L 21/683*   (2006.01)

(52) U.S. Cl.
CPC .. *H01J 37/32082* (2013.01); *H01J 37/32449* (2013.01); *H01L 21/6833* (2013.01); *H01J 2237/24578* (2013.01)

(58) Field of Classification Search
CPC ........... H01J 37/32082; H01J 37/32027; H01J 37/32449; H01J 37/32706; H01J 37/32972; H01J 37/32935; H01J 37/32963
See application file for complete search history.

(56) References Cited

U.S. PATENT DOCUMENTS

| | | | |
|---|---|---|---|
| 6,541,388 B1* | 4/2003 | Saito ................. | H01J 37/32963 438/719 |
| 10,008,370 B2* | 6/2018 | Ohmori ............. | H01J 37/32917 |
| 2007/0249071 A1* | 10/2007 | Lian ........................ | H01L 22/12 702/155 |
| 2008/0190893 A1* | 8/2008 | Mori ................. | H01J 37/32009 257/E21.252 |
| 2009/0186483 A1* | 7/2009 | Saito ................. | H01J 37/32935 438/689 |
| 2012/0280618 A1* | 11/2012 | Utano ...................... | H05H 1/46 315/111.41 |
| 2016/0056017 A1* | 2/2016 | Kim .................. | H01J 37/32706 156/345.28 |
| 2020/0185593 A1* | 6/2020 | Sai .......................... | H01L 41/29 |
| 2021/0005435 A1* | 1/2021 | Jung ................. | H01J 37/32477 |

FOREIGN PATENT DOCUMENTS

JP    7-211768 A    8/1995

* cited by examiner

*Primary Examiner* — Tung X Le (74) *Attorney, Agent, or Firm* — Nath, Goldberg & Meyer; Jerald L. Meyer; Tanya E. Harkins (57) ABSTRACT

A measuring method includes placing a substrate on an electrostatic chuck disposed inside a chamber, attracting the substrate onto the electrostatic chuck, generating plasma inside the chamber, detecting an amount of light reflected at the substrate by light emission of the plasma, and calculating a natural frequency of the substrate based on the amount of light.

9 Claims, 9 Drawing Sheets

MEASURING METHOD AND PLASMA PROCESSING APPARATUS

CROSS-REFERENCE TO RELATED APPLICATION

This application is based upon and claims the benefit of priority from Japanese Patent Application No. 2020-067730, filed on Apr. 3, 2020, the entire contents of which are incorporated herein by reference.

TECHNICAL FIELD

The present disclosure relates to a measuring method and a plasma processing apparatus.

BACKGROUND

Before processing a substrate with plasma, the substrate is attracted to an electrostatic attraction device inside a chamber. In Patent Document 1, means for detecting a parameter indicating an attraction state is installed in an electric circuit formed by a holding target object and an electrode of the electrostatic attraction device. Patent Document 1 provides a method of confirming the attraction state by comparing data detected by the detecting means with data stored in a data storage part in advance by a comparison circuit.

PRIOR ART DOCUMENTS

Patent Documents

Patent Document 1: Japanese laid-open publication No. H07-211768

SUMMARY

According to one embodiment of the present disclosure, there is provided a measuring method includes placing a substrate on an electrostatic chuck disposed inside a chamber, attracting the substrate onto the electrostatic chuck, generating plasma inside the chamber, detecting an amount of light reflected at the substrate by light emission of the plasma, and calculating a natural frequency of the substrate based on the amount of light.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

An embodiment for carrying out the present disclosure will now be described with reference to the drawings. In each drawing, like components will be denoted by like reference numerals and a repeated description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Configuration of Plasma Processing Apparatus]

Figure 1:
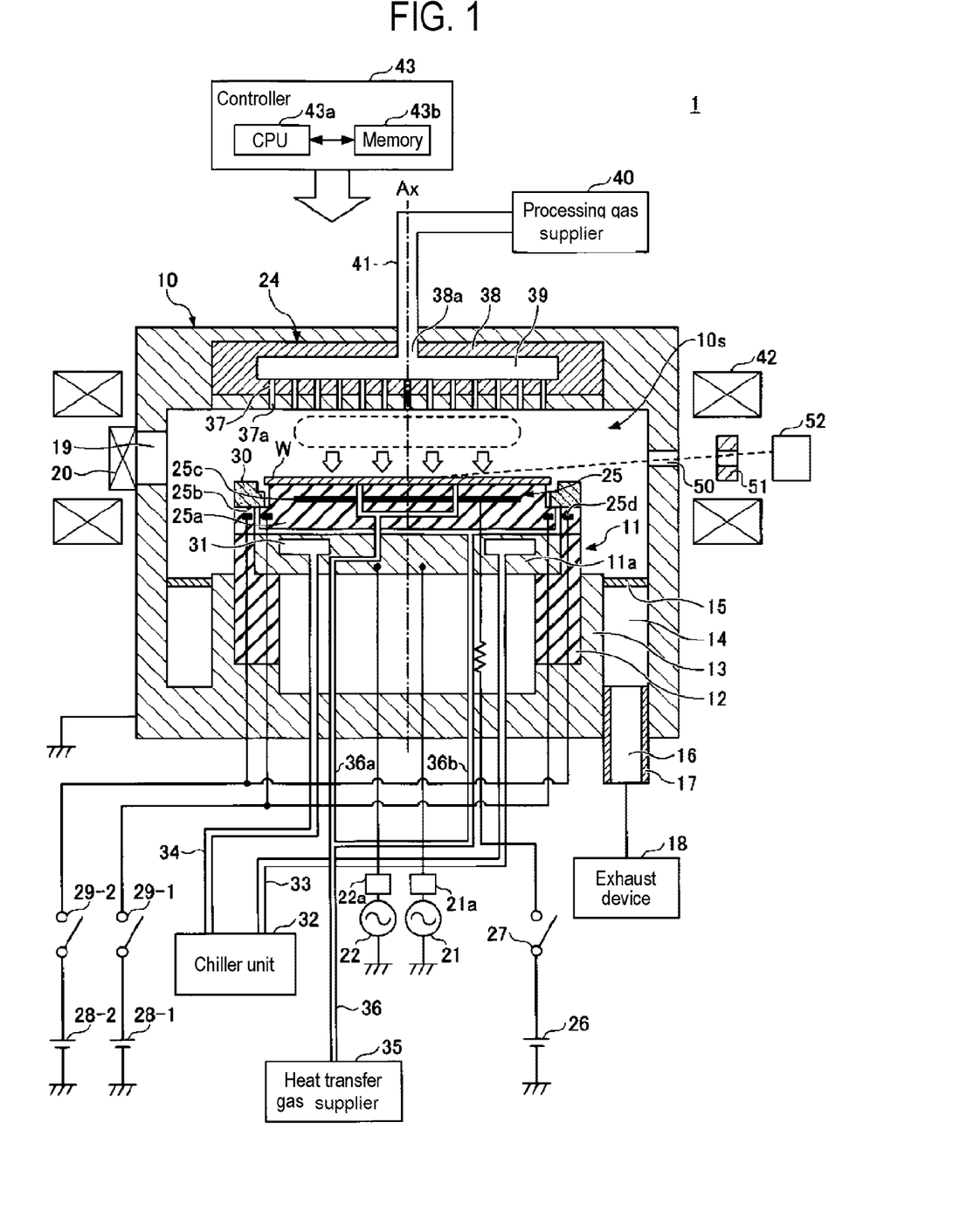
FIG. 1 is a schematic cross-sectional view illustrating an example of a plasma processing apparatus according to an embodiment of the present disclosure.

First, a configuration of a plasma processing apparatus 1 according to an embodiment of the present disclosure will be described with reference to FIG. 1. FIG. 1 is a cross-sectional view illustrating a schematic configuration of the plasma processing apparatus 1 according to an embodiment of the present disclosure. In the present embodiment, a reactive ion etching (RIE) type plasma processing apparatus 1 will be described as an example, but the plasma processing apparatus 1 is not limited thereto and may be applied to a plasma etching device, a plasma CVD device, or the like using surface wave plasma.

The plasma processing apparatus 1 includes, for example, a cylindrical chamber 10 made of a metal. The interior of the chamber 10 functions as a process chamber 10s in which plasma processing such as plasma etching, plasma CVD or the like is performed. The chamber 10 is made of a material such as aluminum or stainless steel, and is grounded.

A disc-like stage (lower electrode) 11 on which a substrate W as an example of a wafer is placed is arranged inside the chamber 10. The stage 11 includes a base 11a and an electrostatic chuck 25. The electrostatic chuck 25 is provided on the base 11a. The base 11a is made of, for example, aluminum, and is supported by a tubular support 13 extending vertically upward from the bottom of the chamber 10 via a tubular insulating holding member 12.

An exhaust passage 14 is formed between a sidewall of the chamber 10 and the tubular support 13. An annular baffle plate 15 is disposed at the entrance or in the middle of the exhaust passage 14 and an exhaust port 16 is provided at the bottom of the exhaust passage 14. An exhaust device 18 is connected to the exhaust port 16 via an exhaust pipe 17. The exhaust device 18 includes a vacuum pump and depressurizes an internal processing space of the chamber 10 to a predetermined degree of vacuum. Furthermore, the exhaust pipe 17 includes an automatic pressure control valve (APC), which is a variable butterfly valve and automatically controls an internal pressure of the chamber 10. In addition, a gate valve 20 for opening and closing a loading/unloading port 19 for the substrate W is provided on the sidewall of the chamber 10.

A first radio frequency power source 21 for plasma generation and RIE is electrically connected to the base 11a via a matcher 21a. The first radio frequency power source 21 applies radio frequency power having a first frequency, for example, radio frequency power having a frequency of 40 MHz, to the base 11a.

A second radio frequency power source 22 for bias application is electrically connected to the base 11a via a matcher 22a. The second radio frequency power source 22 applies radio frequency power having a second frequency lower than the first frequency, for example, radio frequency power having a frequency of 3 MHz, to the base 11a.

In addition, a gas shower head 24 serving as an upper electrode of a ground potential, which will be described later, is disposed on the ceiling of the chamber 10. Therefore, the radio frequency power output from the first radio frequency power source 21 is applied between the stage 11 and the gas shower head 24.

An electrostatic chuck 25 for attracting the substrate W by an electrostatic attraction force is disposed on an upper surface of the stage 11. The stage 11 shares a central axis Ax with the chamber 10. That is, the central axis of the stage 11 is substantially identical to the central axis Ax of the chamber 10. The electrostatic chuck 25 includes a disc-like central portion 25a on which the substrate W is placed, and an annular peripheral portion 25b. A stepped portion is formed between the central portion 25a and the peripheral portion 25b. The central portion 25a is thicker than the peripheral portion 25b. An edge ring 30 configured to annularly surround the periphery of the substrate W is placed on an edge ring placement surface which is an upper surface of the peripheral portion 25b. The edge ring 30 may also be referred to as a focus ring. The edge ring 30 shares the central axis Ax with the chamber 10. That is, the central axis of the edge ring 30 is substantially identical to the central axis Ax of the chamber 10.

Furthermore, the central portion 25a of the electrostatic chuck 25 is configured by sandwiching an attraction electrode 25c formed of a conductive film between a pair of dielectric films. The peripheral portion 25b is configured by sandwiching an electrode plate 25d formed of a conductive film between the pair of dielectric films. A DC power source 26 is electrically connected to the attraction electrode 25c via a switch 27. DC power sources 28-1 and 28-2 are electrically connected to the electrode plate 25d via switches 29-1 and 29-2. The electrostatic chuck 25 generates a Coulomb force by a DC voltage applied from the DC power source 26 to the attraction electrode 25c to attract the substrate W onto the electrostatic chuck 25. In addition, the electrostatic chuck 25 generates a Coulomb force by a DC voltage applied from the DC power sources 28-1 and 28-2 to the electrode plate 25d to attract the edge ring 30 onto the electrostatic chuck 25.

For example, an annular refrigerant room 31 extending in the circumferential direction is provided inside the stage 11. A refrigerant having a predetermined temperature, for example, cooling water, is supplied from a chiller unit 32 to the refrigerant room 31 via pipes 33 and 34 in a circulating manner, and the temperature of the substrate W on the electrostatic chuck 25 is controlled by the temperature of the refrigerant.

A heat transfer gas supplier 35 is connected to a gas supply line 36. The gas supply line 36 is branched into a heat transfer gas line 36a reaching the central portion 25a of the electrostatic chuck 25 and a heat transfer gas line 36b reaching the peripheral portion 25b.

The heat transfer gas supplier 35 supplies a heat transfer gas to a space between a substrate placement surface of the central portion 25a of the electrostatic chuck 25 and a lower surface of the substrate W using the heat transfer gas line 36a. In addition, the heat transfer gas supplier 35 supplies a heat transfer gas to a space between the edge ring placement surface of the peripheral portion 25b of the electrostatic chuck 25 and a lower surface of the edge ring 30 using the heat transfer gas line 36b. As the heat transfer gas, a gas having thermal conductivity, for example, a helium (He) gas or the like, may be suitably used.

The gas shower head 24 provided on the ceiling portion includes an electrode plate 37 provided on a lower surface thereof and an electrode support 38 for detachably supporting the electrode plate 37. The electrode plate 37 includes a plurality of gas holes 37a. In addition, a buffer room 39 is provided inside the electrode support 38. A processing gas supplier 40 is connected to a gas introduction port 38a of the buffer room 39 via a gas supply pipe 41.

Each component of the plasma processing apparatus 1 is connected to a controller 43. The controller 43 controls each component of the plasma processing apparatus 1. The components may include the exhaust device 18, the first radio frequency power source 21, the second radio frequency power source 22, the switches 27, 29-1 and 29-2 for the electrostatic chuck, the DC power sources 26, 28-1 and 28-2, the chiller unit 32, the heat transfer gas supplier 35, the processing gas supplier 40, and the like.

The controller 43 includes a CPU 43a and a memory 43b (storage device), and controls desired substrate processing in the plasma processing apparatus 1 by reading a program and a process recipe stored in the memory 43b and executing them. Furthermore, the controller 43 controls a process of electrostatically attracting the edge ring 30 and a process of supplying the heat transfer gas according to the substrate processing.

A magnet 42 annularly or concentrically extending is arranged around the chamber 10. A horizontal magnetic field directed in one direction is formed by the magnet 42. In addition, a vertical RF electric field is formed by the radio frequency power applied between the stage 11 and the gas shower head 24. Therefore, magnetron discharge is performed through a processing gas inside the chamber 10 to generate plasma from the processing gas near the front surface of the stage 11.

In the plasma processing apparatus 1, during a dry etching process, the gate valve 20 is first opened, and the substrate W to be processed is loaded into the chamber 10 and is placed on the electrostatic chuck 25. Then, the processing gas (e.g., a mixture of a $C_4F_8$ gas, an $O_2$ gas and an Ar gas having a predetermined flow rate ratio) is introduced into the chamber 10 from the processing gas supplier 40, and the interior of the chamber 10 is depressurized by the exhaust device 18 or the like. Furthermore, the radio frequency power is supplied from the first radio frequency power source 21 and the second radio frequency power source 22 to the stage 11, and the DC voltage is applied from the DC power source 26 to the attraction electrode 25c to attract the substrate W onto the electrostatic chuck 25. The heat transfer gas is supplied to the lower surface of the substrate W and the lower surface of the edge ring 30. Thus, the processing gas supplied into the chamber 10 is formed into plasma, and the substrate W is processed by radicals or ions in the plasma.

An observation window 50 is provided on the sidewall of the chamber 10. The observation window 50 is formed of a member such as quartz or the like, which transmits light and maintains airtightness inside the process chamber 10s. A photodetector 52 for detecting light from the observation window 50 is provided outside the plasma processing apparatus 1. An aperture 51 is provided between the observation window 50 and the photodetector 52. The photodetector 52 detects an amount of light (luminance) received through the observation window 50 and the aperture 51 out of the light reflected by the substrate W by light emission of the plasma generated inside the process chamber 10s.

[Light Detection]

Figure 2:
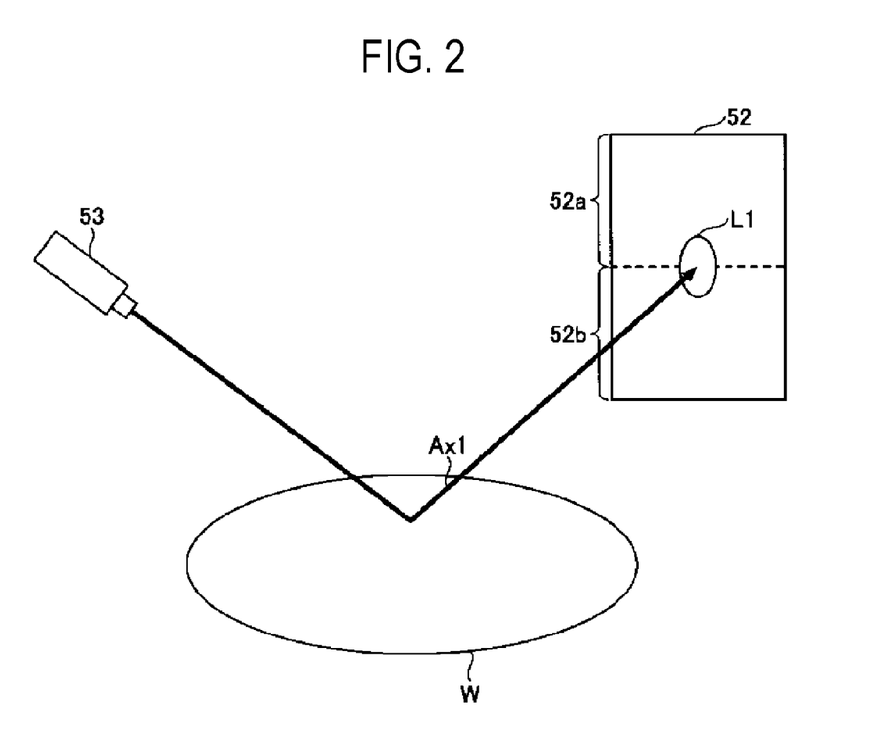
FIG. 2 is a view illustrating an example of light detection using a light source.
Figure 3:
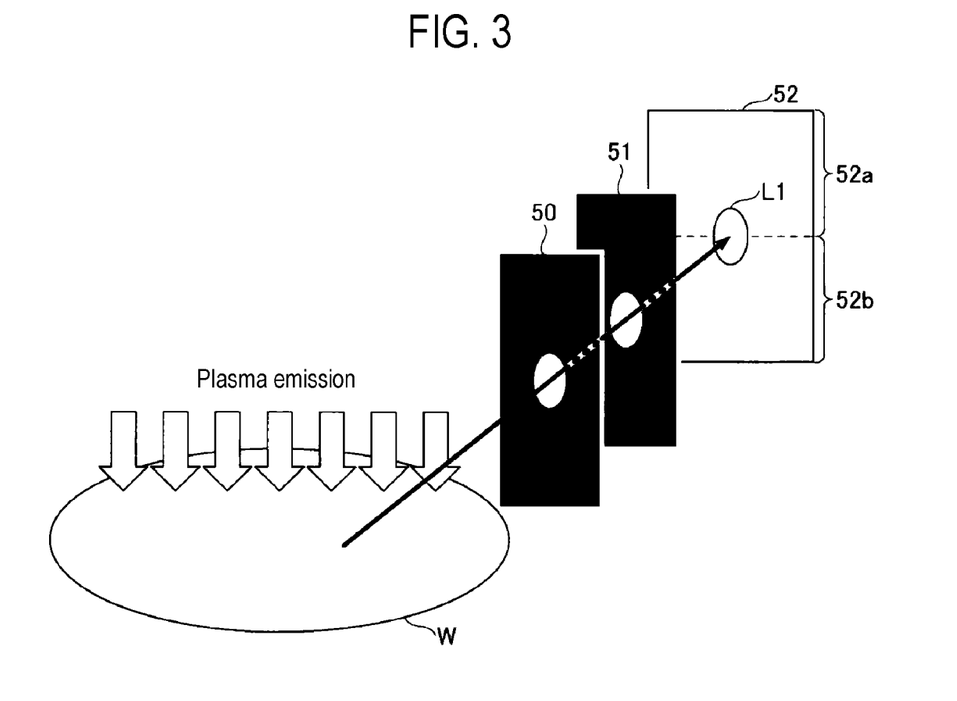
FIG. 3 is a view diagram illustrating an example of light detection using light emission of plasma.

Next, the detection of light amount will be described with reference to the FIGS. 2 and 3. FIG. 2 is a diagram illustrating an example of a light detection using a light source 53. FIG. 3 is a diagram illustrating an example of a light detection using light emission of plasma.

In FIG. 2, laser light is output from the light source 53 and applied to the substrate W. According to Fresnel's law, the reflected light of the substrate W is determined by an incident angle to the substrate W. The light of an optical axis Ax1 reflected at the substrate W is measured by determining the position of the photodetector 52. As the substrate W moves, a path of the reflected light moves and the bright spot of the light detected by the photodetector 52 changes. The photodetector 52 detects a light amount (luminance) L1 of the reflected light. The movement of the substrate W can be measured by a time-dependent change in the detected light amount L1. For example, the photodetector 52 may have a light receiver 52a and a light receiver 52b which are vertically divided. In this case, the light receiver 52a detects a light amount of a region above a dotted line out of the light amount L1. The light receiver 52b detects a light amount of a region lower than the dotted line out of the light amount L1. A movement (vibration) period of the substrate and a natural frequency of the substrate W can be calculated from a time-dependent change in the light amount detected by the light receiver 52a and the light amount detected by the light receiver 52b.

In the plasma processing apparatus 1 according to the present embodiment, the movement period of the substrate W is measured by reflecting light by light emission of plasma illustrated in FIG. 3 at the substrate W without using the light source 53. The principle of detecting the light amount by the photodetector 52 is identical to that when using the light source 53 illustrated in FIG. 2.

In FIG. 3, the photodetector 52 includes, but is not limited to, the vertically divided two light receivers 52a and 52b. The photodetector 52 may include two light receivers which are horizontally divided, four light receivers which are vertically and horizontally divided, or a single light receiver.

In the present embodiment, when the light source is plasma, uniform light is incident on the substrate W using plasma as a continuous light source and is reflected by hitting the substrate W. At this time, the light incident on the substrate W may be biased. Furthermore, when plasma is made to blink in a pulse-like manner, the light may be incident on the substrate W in a pulse-like manner.

The light reflected by hitting the substrate W is measured by determining the position of the photodetector 52. If vibration, warpage or deflection occurs on the substrate W, the path of the reflected light of the substrate W varies. The photodetector 52 measures a change in the path of the incident light as a time-dependent change in the light amount detected by each of the plurality of divided light receivers. Furthermore, by providing the observation window 50 and the aperture 51, the photodetector 52 may measure the change in the path of the incident light as a change in the position of the light amount detected by each of the plurality of divided light receivers. In some embodiments, the aperture 51 may be omitted.

With this configuration, the photodetector 52 may measure a time-dependent change in the light amount or a time-dependent change in variation of the light amount, or a position-dependent change (position-dependent change in the light) used in detecting the bright spot of the light based on the detected light amount. When measuring the time-dependent change in the light amount or the time-dependent change in variation of the light amount, it may be difficult to correctly calculate the natural frequency of the substrate W because the detected value of the light amount varies depending on a change in plasma emission intensity. On the other hand, when measuring the position-dependent change in light, even if the plasma emission intensity varies, the natural frequency of the substrate W can be more accurately calculated in order to measure the positional deviation of the detected bright spot.

Thus, the plasma processing apparatus 1 according to the present embodiment can calculate the natural frequency of the substrate W based on the light amount detected by using the light emission of plasma, without using a light source, a measuring device for directly measuring the nature frequency of the substrate W and a measuring probe. During the plasma processing, the substrate W vibrates at a frequency corresponding to a mechanical resonance of the electrostatic chuck 25 by heat input from the plasma. In the present embodiment, the natural frequency of the substrate W by the thermal vibration is calculated.

(1) The change in the path of light is detected as a change in the light amount, or (2) the change in the path of light is detected as a change in the position of light by using the aperture. By recognizing the change detected by (1) or (2) described above as a transient response, it is possible to detect the warpage or deflection of the substrate W. In addition, by recognizing the change detected by (1) or (2) above as a time-dependent change, it is possible to detect the natural frequency of the substrate W, and to detect the attraction state of the electrostatic chuck 25 based on the natural frequency. Furthermore, by recognizing the change detected by (1) or (2) above as an angle-dependent change, it is possible to detect an orientation of warpage or deflection of the substrate W and an orientation of the attraction state (vibration of the substrate W).

Figure 4:
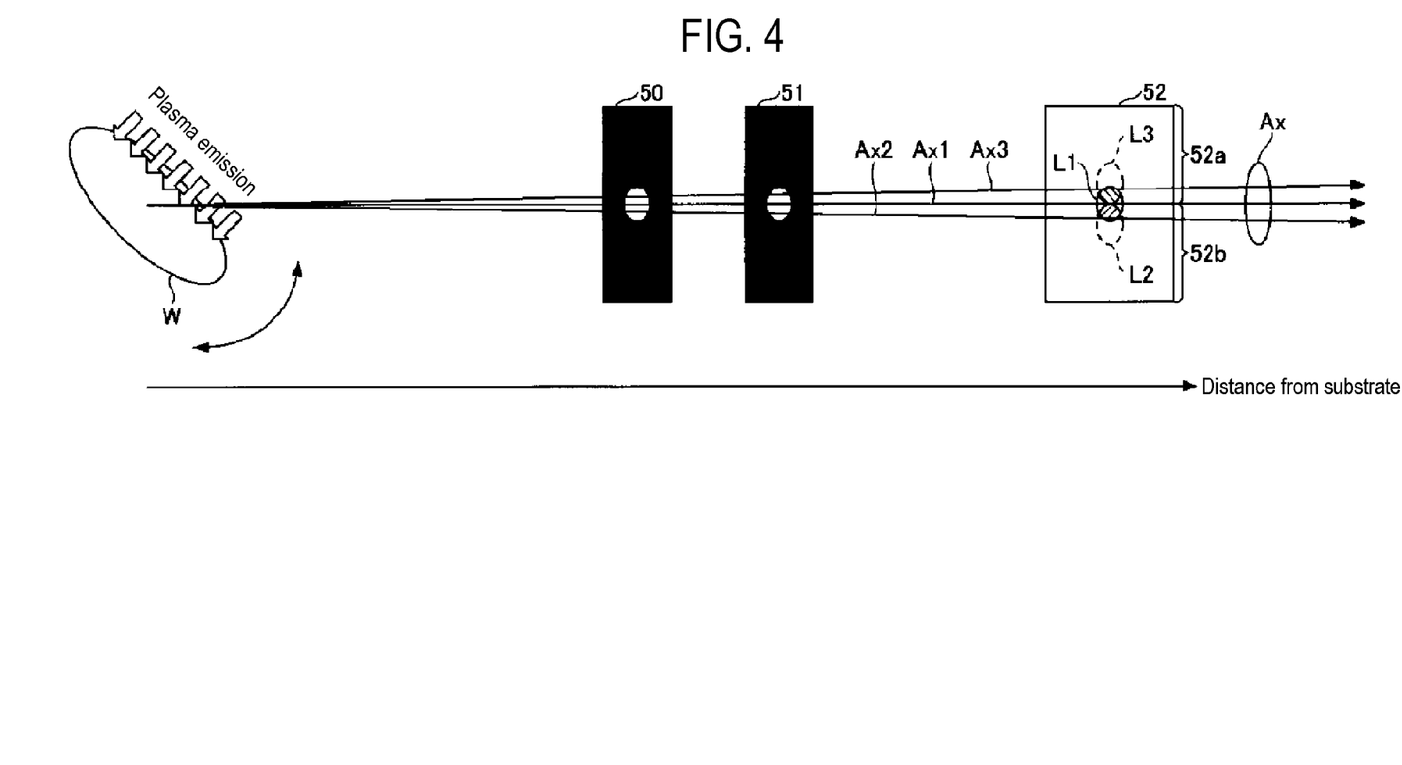
FIG. 4 is a view illustrating an example of detecting an inclination and a light amount of a substrate according to an embodiment of the present disclosure.

FIG. 4 is a diagram illustrating an example of detecting an inclination and a light amount of the substrate W according to an embodiment of the present disclosure. As illustrated in FIG. 4, an optical axis of light reflected at the substrate W shifts depending on the inclination of the substrate W. For example, different lights of optical axes Ax1 to Ax3 are directed to the photodetector 52 depending on the inclination of the substrate W. The light of the optical axis Ax1 passing through the observation window 50 is not blocked by the aperture 51. Thus, the light receivers 52a and 52b of the photodetector 52 detect the light amount L1.

A lower portion of the light of the optical axis Ax2 passing through the observation window 50 is blocked by the aperture 51. Thus, the light receiver 52a of the photodetector 52 detects a light amount of a shaded portion in which L1 and L2 overlap, out of a light amount L2 detected when the aperture 51 does not exist. At this time, the light receiver 52b does not detect a light amount with respect to the light of the optical axis Ax2.

An upper portion of light of the optical axis Ax3 passing through the observation window 50 is blocked by the aperture 51. Thus, the light receiver 52b of the photodetector 52 detects a light amount of a shaped portion in which L1 and L3 overlap, out of a light amount L3 detected when the aperture 51 does not exist. At this time, the light receiver 52a does not detect a light amount with respect to the light of the optical axis Ax3.

Thus, it is possible to measure the time-dependent change in the light amount detected by the light receivers 52a and 52b and the position-dependent change in the detected light, and to detect the inclination of the substrate W from the light amount and the displacement of the detection position in the vertical direction (i.e., the deviation of the optical axis in the longitudinal direction).

The photodetector 52 may be implemented by a photodiode. The photodetector 52 may measure the light amount by converting the light received by using the photodiode into a voltage and detecting the voltage. Thus, it is possible to measure the vibration state of the substrate W depending on a periodic time-dependent change in the light amount or a periodic position-dependent change in the light amount.

In a case in which the light receiver of the photodetector 52 is horizontally divided, a time-dependent change in light amount and/or a position-dependent change in light are measured by detecting the light amount by two divided light receivers at the left and right sides. Thus, it is possible to determine the warpage or deflection of the substrate W at the left and right sides from the time-dependent change in the light amount or the position-dependent change in the light in the lateral direction of the light receiving region.

In a case in which the light receiver of the photodetector 52 is vertically and horizontally divided into four, a time-dependent change in light amount and/or a position-dependent change in light in four regions of the vertically and horizontally divided light receivers are measured by detecting the light amount and the position of the light by the four divided light receivers. Thus, it is possible to detect both longitudinal and lateral changes in the light amount and the position of the light of the light receivers. Accordingly, it is possible to measure a periodic vibration of the substrate W, an orientation of the periodic vibration, warpage or deflection, and an orientation of the warpage or deflection of the substrate W.

According to the measuring method described above, the longer the distance between the photodetector 52 and the substrate W, the wider the distance between the optical axes Ax1 to Ax3 of the lights L1 to L3 reaching the photodetector 52, and the higher the detection sensitivity of the light amount by the photodetector 52.

Furthermore, according to the measuring method, since the periodic position-dependent change in the light is detected, strong measurement against disturbance can be performed. That is, by detecting the periodic position-dependent change in the light reflected from the substrate W, even if the detected light amount varies depending on the emission intensity of plasma, it is possible to measure the periodic vibration state of the substrate W without being affected by the change in the light amount.

In addition, according to the measuring method, the photodetector 52 can measure not only the light amount but also the displacement of the position of the light to be detected. Thus, it is possible to measure the periodic vibration state of the substrate W by using the reflected light of the substrate W not only by continuous plasma emission but also by pulsed plasma emission.

Moreover, since the observation window 50 and the light emission monitor are provided in the plasma processing apparatus 1, the measuring method according to the present embodiment can be performed only by adding the photodetector 52 to the plasma processing apparatus 1, thereby suppressing cost increase.

[Detected Value of Light Amount and Resonance]

Figure 5A:
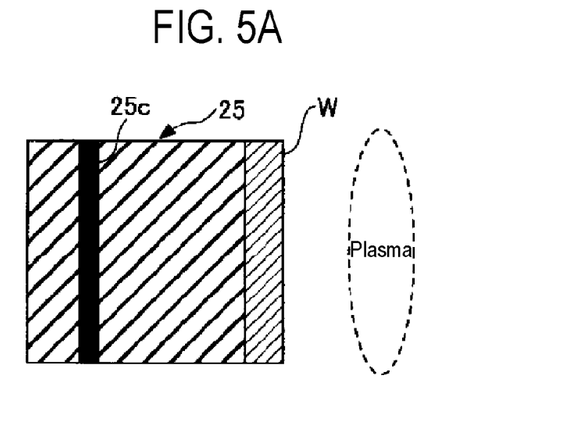
FIGS. 5A and 5B are diagrams illustrating an equivalent circuit of an electrostatic chuck according to an embodiment of the present disclosure.
Figure 5B:
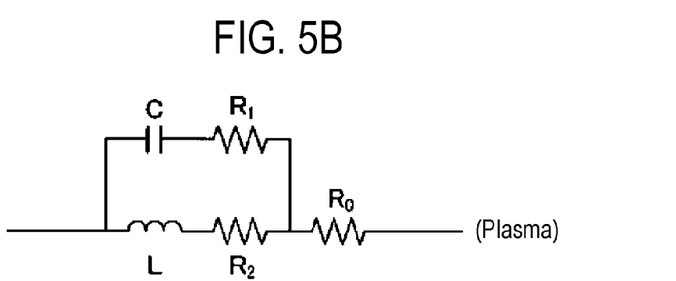
Figure 6:
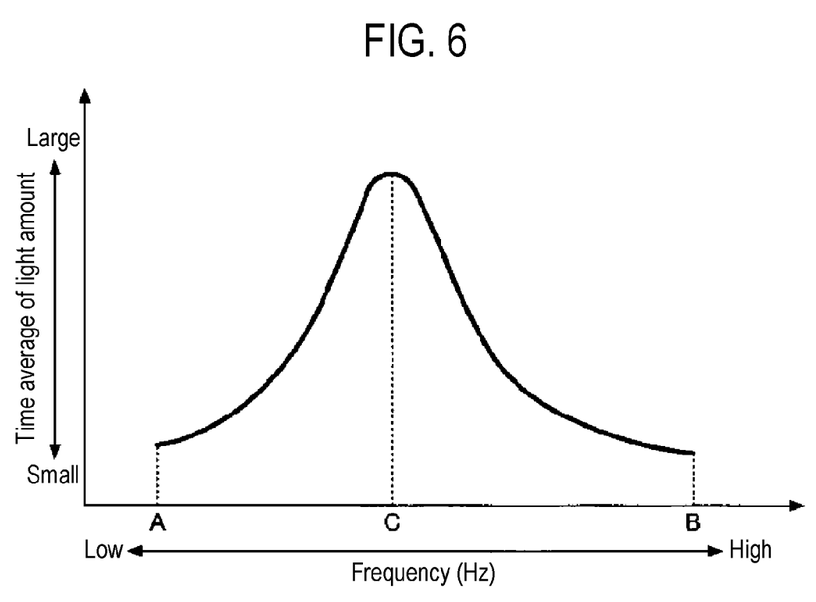
FIG. 6 is a diagram illustrating an example of correlation information between a vibration frequency, a light amount, and a time average according to an embodiment of the present disclosure.

Next, a detected value of the light amount and resonance will be described with reference to FIGS. 5A and 5B, and FIG. 6. FIGS. 5A and 5B are diagrams illustrating an equivalent circuit of the electrostatic chuck 25 according to an embodiment of the present disclosure. FIG. 6 is a diagram illustrating an example of correlation information between a vibration frequency, a light amount, and a time average according to an embodiment of the present disclosure. The time average of the light amount indicates an average value of time-dependent change in detected light amount or an average value of light amount for a predetermined time.

The equivalent circuit of the electrostatic chuck 25 illustrated in FIG. 5A is illustrated in FIG. 5B. The right side of the equivalent circuit in FIG. 5B is a plasma side. In the equivalent circuit, elements of C and R1 of the electrostatic chuck 25 connected in series and elements of L and R2 of the attraction electrodes 25c in the electrostatic chuck 25 connected in series are connected in parallel, and an element of R0 of the substrate W is connected in series.

The substrate W minutely vibrates by heat input from plasma. The natural frequency of the substrate W is equal to a resonance frequency corresponding to impedance of the electrostatic chuck 25 (including the attraction electrode 25c) in FIG. 5B. Since the resonance frequency based on the mechanical resonance of the electrostatic chuck 25 (including the attraction electrode 25c) varies depending on a material or structure of the electrostatic chuck 25, the natural frequency of the substrate W varies depending on the material or structure of the electrostatic chuck 25.

The measuring method according to the present embodiment calculates the time average of the light amount detected by the photodetector 52 and calculates the natural frequency of the substrate W from the time average of the light amount calculated based on the correlation information between the time average of the light amount and the vibration frequency (see FIG. 6).

In FIG. 6, the horizontal axis indicates a frequency (Hz) and the vertical axis indicates a time average of light amount. For example, when measuring the time average of light amount in the frequency band from frequencies A to B, a peak like the curve in FIG. 6 appears. The correlation between the time average of the light amount and the frequency varies depending on the state of the attraction force by which the substrate W is attracted by the electrostatic chuck 25. The controller 43 calculates a frequency C corresponding to the peak of the time average of the light amount as a resonance frequency, i.e., the natural frequency of the substrate W. Furthermore, the frequencies A to B may be set in a band of approximately several Hz to 10 GHz in consideration of the mechanical resonance of the electrostatic chuck 25.

[Measuring Method]

Figure 7:
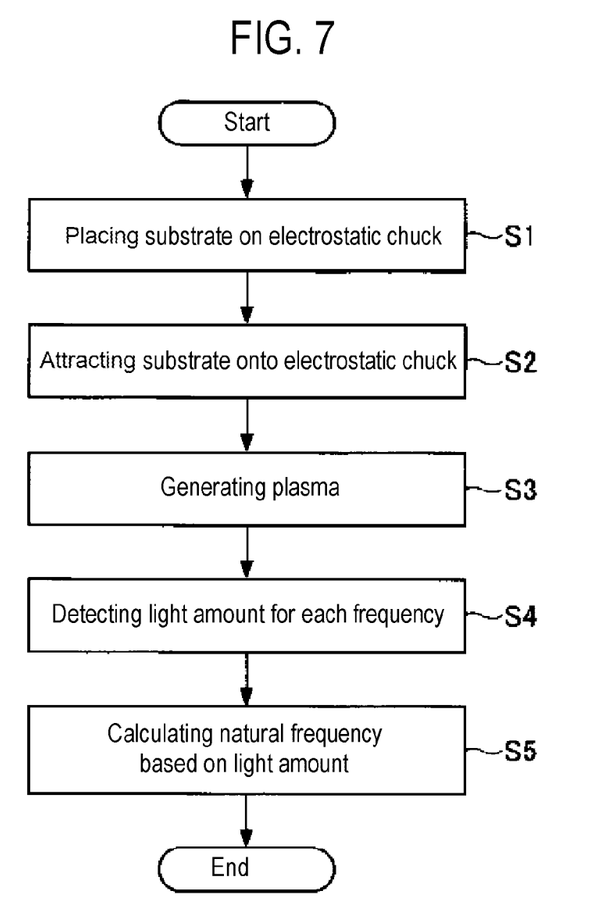
FIG. 7 is a flowchart illustrating an example of a measuring method according to an embodiment of the present disclosure.

Next, the measuring method according to the present embodiment will be described with reference to FIG. 7. FIG. 7 is a flowchart illustrating an example of the measuring method according to an embodiment of the present disclosure. A process of FIG. 7 is performed by the controller 43.

When the process starts, the controller 43 places the substrate W on the electrostatic chuck 25 disposed inside the chamber 10 (step S1). Then, the controller 43 attracts the substrate W onto the electrostatic chuck 25 (step S2). Subsequently, the controller 43 supplies a processing gas into the chamber 10 and applies radio frequency power to the stage 11 to generate plasma (step S3). The applied radio frequency power is, for example, radio frequency power having a first frequency. The radio frequency power having a second frequency may be included in the applied radio frequency power.

Subsequently, the controller 43 controls the photodetector 52 to detect an amount of light reflected at the substrate W by light emission of plasma, measure a time-dependent change in the light amount, and perform spectroscopy with respect to the time-dependent change in the light amount so as to detect an amount of light for each frequency (step S4). Then, the controller 43 calculates a peak of a time average of the detected light amount for each frequency as the natural frequency of the substrate W (step S5), and the process ends. For example, in the example of FIG. 6, a frequency C of the peak that appears when the time average of the light amount is plotted from the frequencies A to B is the resonance frequency, and is calculated as the natural frequency of the substrate W.

EXAMPLES

Next, examples 1 to 3 of the measuring method according to the present embodiment will be described with reference to FIGS. 8 to 11.

Example 1

Figure 8:
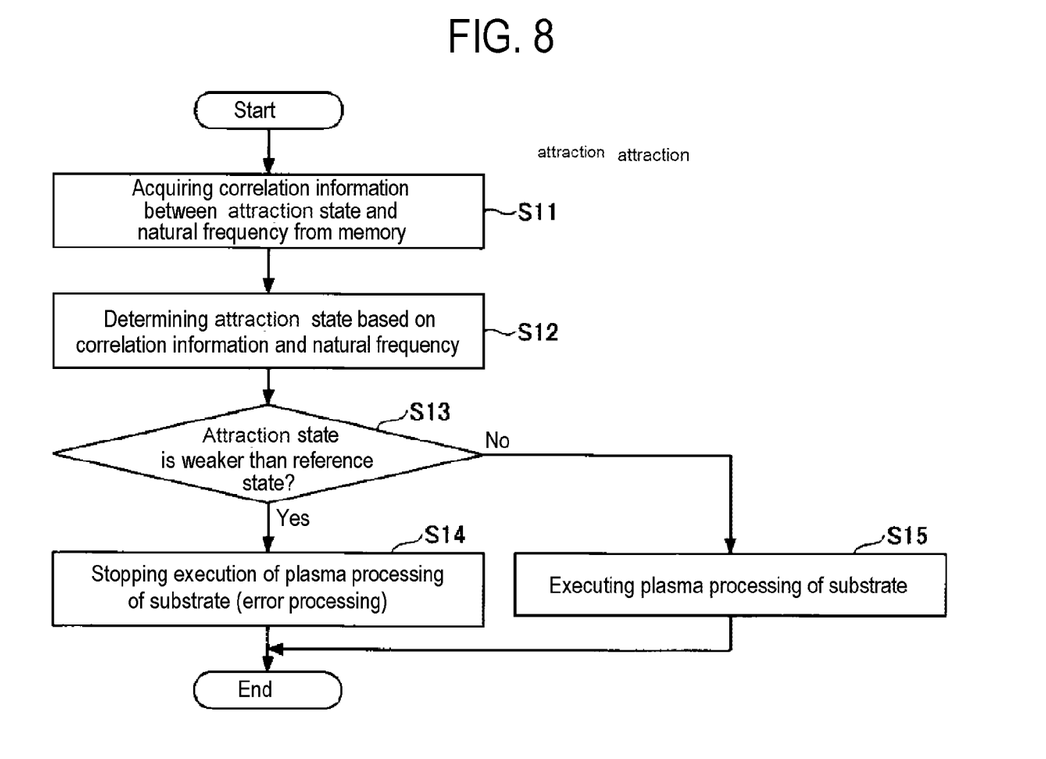
FIG. 8 is a flowchart illustrating a first example (determination control of an attraction state) of the measuring method of FIG. 7.
Figure 9:
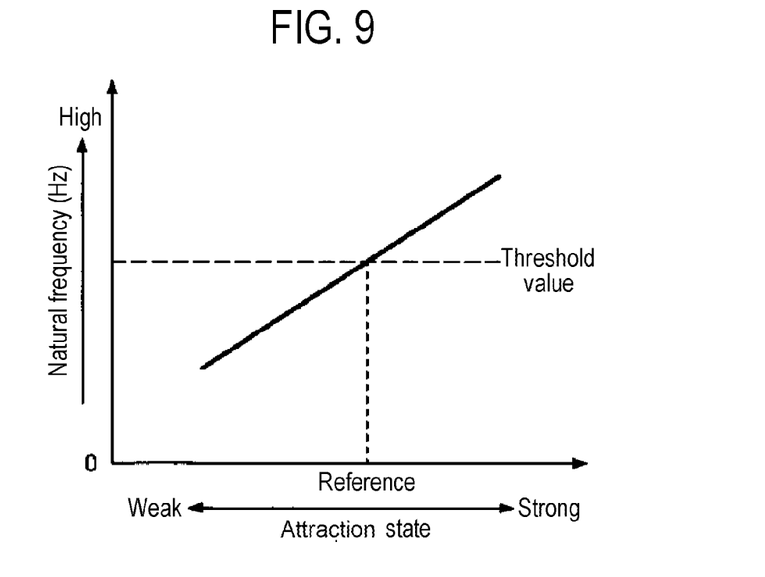
FIG. 9 is a diagram illustrating an example of correlation information between an attraction state and a natural frequency according to an embodiment of the present disclosure.

Example 1 in which determination control of an attraction state is performed based on the natural frequency of the substrate W calculated by the measuring method of FIG. 7 will be described with reference to FIG. 8. FIG. 8 is a flowchart illustrating example 1 (determination control of the attraction state) of the measuring method of FIG. 7. In example 1, after performing the measuring method of FIG. 7, the control of determining the attraction state of the electrostatic chuck is performed using the calculated natural frequency. Correlation information between the attraction state and the natural frequency is stored in the memory 43b in advance before performing this processing. FIG. 9 is a diagram illustrating an example of the correlation information between the attraction state and the natural frequency according to an embodiment of the present disclosure. A threshold value indicating an example in FIG. 9 is preset to determine whether the attraction state of the electrostatic chuck 25 is normal, and is stored in the memory 43b.

Subsequent to the measuring method of FIG. 7, when the process of FIG. 8 starts, the controller 43 obtains the correlation information between the attraction state and the natural frequency (see FIG. 9) from the memory 43b (step S11). Then, the controller 43 determines the attraction state of the electrostatic chuck 25 with respect to the natural frequency calculated based on the achieved correlation information between the attraction state and the natural frequency (step S12).

Subsequently, the controller 43 determines whether the attraction state is weaker than a reference state (step S13). In an example of FIG. 9, when the calculated natural frequency is lower than the preset threshold value, it can be determined that the attraction state is weaker than the reference state.

When it is determined that the attraction state is weaker than the reference state, the controller 43 stops execution of plasma processing on the substrate W (step S14), performs error processing such as a display to stop the execution of the processing and then terminates this process. When it is determined that the attraction state is the reference state or is stronger than the reference state, the controller 43 executes the plasma processing of the substrate W (step S15) and then terminates this process.

According to this, the attraction state of the substrate can be determined by detecting the light reflected at the substrate W by the light emission of plasma through the use of the photodetector 52 and calculating the natural frequency of the substrate W based on the light amount. In step S14, the error processing may be omitted. Furthermore, in step S14, an operator may determine whether to stop the execution of the plasma processing by performing a process of making the execution of the plasma processing of the substrate W not automatically stopped and notifying the fact that the absorption state is weaker than the reference state by a display or the like.

Example 2

Figure 10:
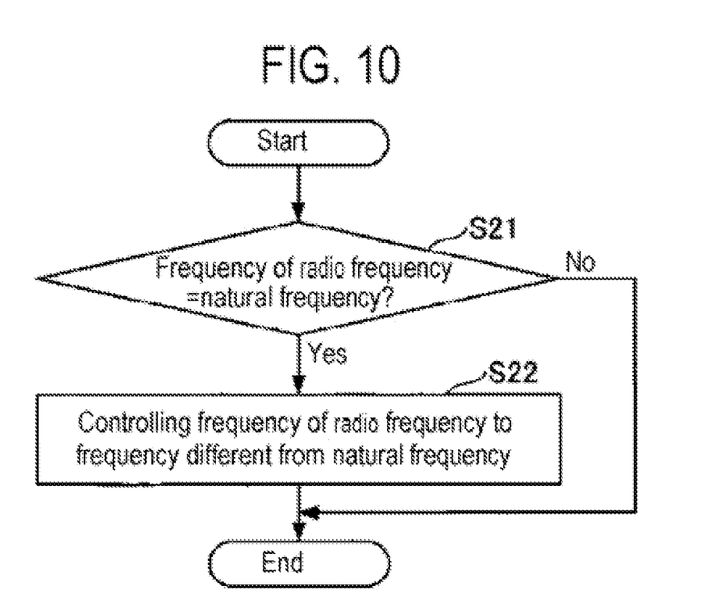
FIG. 10 is a flowchart illustrating a second example (frequency control of radio frequency power) of the measuring method of FIG. 7.

Next, example 2 in which frequency control of radio frequency power is performed based on the natural frequency of the substrate W calculated by the measuring method of FIG. 7 will be described with reference to FIG. 10. FIG. 10 is a flowchart illustrating example 2 (frequency control of radio frequency power) of the measuring method of FIG. 7.

Subsequent to the measuring method of FIG. 7, when the process of FIG. 10 starts, the controller 43 determines whether a frequency of radio frequency power is equal to the natural frequency (step S21). When it is determined that the frequency of the radio frequency power is equal to the natural frequency, the controller 43 controls the frequency of the radio frequency power to a frequency different from the natural frequency (step S22).

According to this, by controlling the frequency of the radio frequency power to a frequency different from the natural frequency, it is possible to suppress energy loss of radio frequency power. In addition, the frequency of the radio frequency power controlled by this process will be controlled for frequencies of radio frequency output from both the first radio frequency power source 21 and the second radio frequency power source 22. Furthermore, whether or not the frequency of the radio frequency power in step S21 is equal to the natural frequency may include not only a case where the frequency of the radio frequency power is completely equal to the natural frequency, but also a case where the frequency of the radio frequency power is not completely equal to but substantially equal to the natural frequency.

Example 3

Figure 11:
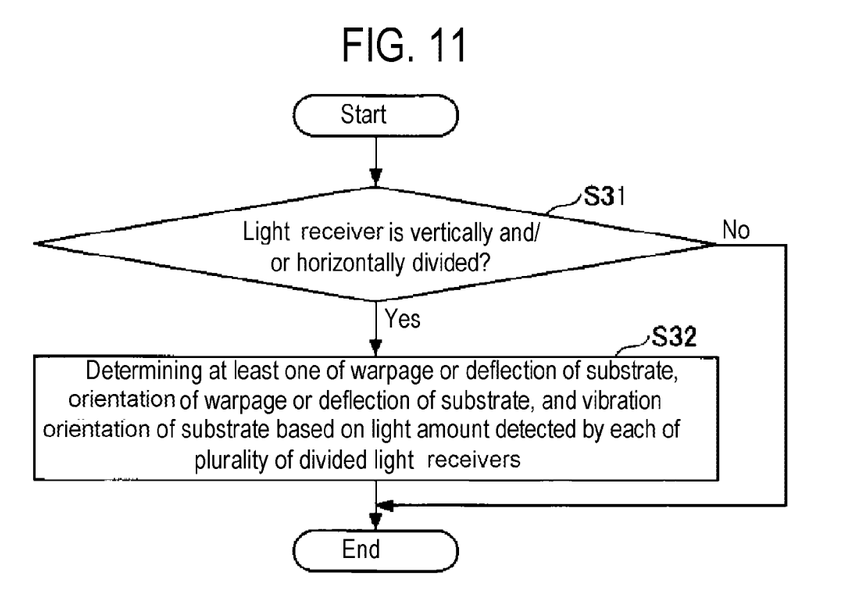
FIG. 11 is a flowchart illustrating a third example (determination control of warpage or deflection of a substrate) of the measuring method of FIG. 7.

Next, example 3 in which determination control of warpage or deflection of the substrate W will be described with reference to FIG. 11. FIG. 11 is a flowchart illustrating example 3 of the measuring method of FIG. 7 (determination control of warpage or deflection of the substrate). Example 3 is provided based on the assumption that the photodetector 52 includes two or four divided light receivers.

Subsequent to the measuring method of FIG. 7, when the process of FIG. 11 starts, the controller 43 determines whether the light receiver of the photodetector 52 is vertically and/or horizontally divided (step S31). When the light receiver of the photodetector 52 is not vertically and/or horizontally divided, the controller 43 terminates this process.

When it is determined that the light receiver of the photodetector 52 is vertically and/or horizontally divided, the controller 43 determines at least one of the warpage or deflection, an orientation of the warpage or deflection of the substrate W, and a vibration orientation of the substrate W based on the light amount detected by each light receiver (step S32). Thereafter, the process ends.

According to this, the light reflected at the substrate W by the light emission of plasma can be detected by the plurality of divided light receivers of the photodetector 52, and the natural frequency of the substrate W, the vibration orientation of the substrate W, and the state and orientation of the warpage or deflection of the substrate W can be determined based on the light amount detected by each light receiver.

As described above, according to the measuring method and the plasma processing apparatus 1 of the present embodiment and the examples, it is possible to detect the attraction state of the electrostatic chuck using the light emission by plasma. In addition, it is possible to suppress the energy loss of radio frequency power by controlling the frequency of the radio frequency power applied to the chamber 10 to a frequency different from the natural frequency. Furthermore, it is possible to determine at least one of the warpage or deflection of the substrate W, the orientation of the warpage or deflection of the substrate W, and the vibration orientation of the substrate W based on the amount of light detected by the plurality of divided light receivers of the photodetector 52.

It should be noted that the measuring method and the plasma processing apparatus according to an embodiment of the present disclosure disclosed herein are exemplary in all respects and are not restrictive. The embodiment and the examples described above may be modified and improved in various forms without departing from the scope and spirit of the appended claims. The matters described in the embodiments and the examples described above may be combined unless a conflict arises, and other configurations may be employed unless a conflict arises.

For example, the measuring method according to the present disclosure may execute two or three of the process of example 1 (FIG. 8), the process of example 2 (FIG. 10), and the process of example 3 (FIG. 11) in no particular order after the process of FIG. 7.

The plasma processing apparatus of the present disclosure may be applied to any type of an atomic layer deposition (ALD) apparatus, capacitively coupled plasma (CCP) apparatus, inductively coupled plasma (ICP) apparatus, radial line slot antenna (RLSA) apparatus, electron cyclotron resonance plasma (ECR) apparatus, and helicon wave plasma (HWP) apparatus.

The plasma processing apparatus may be an apparatus that performs a predetermined process (for example, an etching process, a film forming process, a cleaning process, an ashing process, or the like) using plasma on a substrate.

According to the present disclosure in some embodiments, it is possible to detect an attraction state of an electrostatic chuck using light emission by plasma.

What is claimed is:

1. A measuring method, comprising:
   placing a substrate on an electrostatic chuck disposed inside a chamber;
   attracting the substrate onto the electrostatic chuck;
   generating plasma inside the chamber;
   detecting an amount of light reflected at the substrate by light emission of the plasma;
   performing spectroscopy with respect to a time-dependent change in the detected amount of light so as to detect an amount of light for each frequency; and
   calculating a natural frequency of the substrate based on the amount of light for each frequency detected in the performing spectroscopy.

2. The measuring method of claim 1, further comprising:
   determining an attraction state of the electrostatic chuck based on the natural frequency.

3. The measuring method of claim 2, further comprising:
   determining whether or not to execute a plasma processing of the substrate based on the natural frequency.

4. The measuring method of claim 3, further comprising:
   stopping execution of the plasma processing of the substrate when the natural frequency is smaller than a threshold value.

5. The measuring method of claim 4, further comprising:
   controlling a frequency of radio frequency power applied to the chamber to a frequency different from the natural frequency.

6. The measuring method of claim 5, wherein the detecting the amount of light includes:
   detecting the amount of light by each of a plurality of divided light receivers of a photodetector; and
   determining at least one of warpage or deflection of the substrate, an orientation of the warpage or deflection of the substrate, and a vibration orientation of the substrate, based on a time-dependent change in the amount of light and/or a position-dependent change in the amount of light detected by each of the plurality of divided light receivers.

7. The measuring method of claim 1, further comprising:
   controlling a frequency of radio frequency power applied to the chamber to a frequency different from the natural frequency.

8. The measuring method of claim 1, wherein the detecting the amount of light includes:
   detecting the amount of light by each of a plurality of divided light receivers of a photodetector; and
   determining at least one of warpage or deflection of the substrate, an orientation of the warpage or deflection of the substrate, and a vibration orientation of the substrate, based on a time-dependent change in the amount of light and/or a position-dependent change in the amount of light detected by each of the plurality of divided light receivers.

9. A plasma processing apparatus provided with a chamber, an electrostatic chuck disposed inside the chamber, and a controller,
   wherein the controller is configured to control a process, the process comprising:
   placing a substrate on the electrostatic chuck disposed inside the chamber;
   attracting the substrate onto the electrostatic chuck;
   generating plasma inside the chamber;
   detecting an amount of light reflected at the substrate by light emission of the plasma;
   performing spectroscopy with respect to a time-dependent change in the detected amount of light so as to detect an amount of light for each frequency; and calculating a natural frequency of the substrate based on the amount of light for each frequency detected in the performing spectroscopy.

\* \* \* \* \*